United States Patent [19]

Matsuda et al.

[11] Patent Number: 4,812,420

[45] Date of Patent: Mar. 14, 1989

[54] METHOD OF PRODUCING A SEMICONDUCTOR DEVICE HAVING A LIGHT TRANSPARENT WINDOW

[75] Inventors: Sadamu Matsuda, Sakai; Kunito Sakai, Itami; Takashi Takahama, Amagasaki, all of Japan

[73] Assignee: Mitsubishi Denki Kabushiki Kaisha, Tokyo, Japan

[21] Appl. No.: 102,610

[22] Filed: Sep. 30, 1987

[30] Foreign Application Priority Data

Sep. 30, 1986 [JP]  Japan ............................. 61-234088
May 13, 1987 [JP]  Japan ............................. 62-116097

[51] Int. Cl.⁴ ........................................... H01L 21/56
[52] U.S. Cl. ................................. 437/209; 437/214; 29/832; 29/841; 29/848; 29/837; 264/272.11; 264/272.17
[58] Field of Search ............... 437/209, 211, 212, 224; 29/832, 837, 841, 848; 264/272.11, 272.13, 272.17

[56] References Cited

U.S. PATENT DOCUMENTS 3,622,419 11/1971 London et al. ..................... 437/209

FOREIGN PATENT DOCUMENTS 0048943 of 1980 Japan ............................. 437/209
0031043 of 1984 Japan ............................. 437/209
0193345 of 1985 Japan ............................. 437/211
0233241 of 1986 Japan ............................. 437/211
0163644 of 1986 Japan ............................. 437/211

Primary Examiner—Brian E. Hearn
Assistant Examiner—Beverly A. Pawlikowski
Attorney, Agent, or Firm—Birch, Stewart, Kolasch & Birch

[57] ABSTRACT

A method of producing a semiconductor device having a light transparent window, includes: a process of die bonding a chip onto a lead frame; a process of attaching a wall surrounding a picture element to either of the external contour surface of the surface of the chip or the light transparent window surrounding the picture element; a process of inserting the chip and the light transparent window into a metal mold in such a manner that an empty closed space is produced between the chip and the light transparent window via the wall; and a process of plastic molding the device except for the light transparent window by filling resin into the metal mold and making the resin hardened.

21 Claims, 2 Drawing Sheets

METHOD OF PRODUCING A SEMICONDUCTOR DEVICE HAVING A LIGHT TRANSPARENT WINDOW

FIELD OF THE INVENTION

The present invention relates to a method of producing a semiconductor device having a light transparent window in which an optical semiconductor can be plastic sealed without damaging its optical characteristics.

BACKGROUND ART

As a semiconductor device having a light transparent window a solid state imaging element will be described.

FIG. 6 shows a cross-section of a prior art ceramic sealed solid state imaging element. The reference numeral 1 designates a ceramic base for including a chip 6, the reference numeral 2 designates a ceramic lid, the reference numeral 3 designates low melting point glass for making the ceramic base 1 and the ceramic lid 2 adhere to the lead frame 4, the reference numeral 5 designates conductive adhesive material for fixing the chip 6, the reference numeral 7 designates a bonding wire for connecting the lead frame 4 to the terminal of the chip 6, the reference numeral 8 designates a metal cap, the reference numeral 9 designates low melting point glass, the reference numeral 10 designates light transparent glass, the reference numeral 11 designates a metal which is metallized at the aperture portion of the ceramic lid 2, and the reference numeral 12 designates a space.

The method of producing this solid state imaging element will be described.

At first, low melting point glass 3 is applied to the ceramic base 1 and the ceramic lid 2. Next, the low melting point glass 3 is melted and solidified at about 500° C. such that the lead frame 4 is held between the ceramic base 1 and the ceramic lid 2 via the low melting point glass 3. After cooling, a chip 6 is fixed to the conductive adhesive material 5 in the ceramic base 1. Next, bonding wires 7 are wired so as to electrically connect the terminal of the chip 6 to the lead frame 4. Next, an element obtained by adding the light transparent glass 10 to the metal cap 8 by low melting point glass 9 is placed onto the metal 11 metallized over the surface of the aperture portion of the ceramic lid 2, whereby a space 12 is produced which is completely isolated from the outside air.

In the prior art method of producing a semiconductor device having a light transparent window such as a solid state imaging element, ceramic and metal are mainly used as constitutional material of the device, and therefore it is necessary to provide a process of melting and solidifying the low melting point glass 3 and a process of making the light transparent glass 10 adhere to the metal cap 8 by the low melting point glass 9. The production process thus becomes complicated, causing difficulty in mass producibility. Furthermore, the chip 6 is non-impervious to heat, and it is thus required to increase the size of the metal cap 8 in order to reduce the influence of heat upon welding the metal cap 8 onto the metallized metal 11, thereby resulting in a disadvantage that the sealed size becomes unecessary large.

SUMMARY OF THE INVENTION

An object of the present invention is to provide a method of producing a semiconductor device having a light transparent window which is superior in mass producibility and capable of producing a semiconductor device having a small sealed size.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a method of producing a semiconductor device having a light transparent window, which comprises: a process of die bonding a chip onto a lead frame; a process of attaching a wall surrounding a picture element to either of the external contour surface of the surface of the chip or the light transparent window surrounding the picture element; a process of inserting the chip and the light transparent window into a metal mold in such a manner that a closed space is produced between the chip and the light transparent window via the wall; and a process of plastic molding the device except for the light transparent window by filling in resin into the metal mold and hardening the resin.

BRIEF DESCRIPTION OF THE DRAWINGS

FIGS. 1 to 3 are diagrams for explaining a method of producing a semiconductor device as a first embodiment of the present invention, wherein;

FIG. 1 is a plan view showing a state where a wall of silicon rubber is produced on the external contour surface surrounding a picture element on a chip surface;

FIG. 2 is a cross-sectional view showing a state where a large transparent window is position determined on the chip via the wall; and FIG. 3 is a cross-sectional view showing a state where resin is sealed in the metal mold;

DETAILED DESCRIPTION OF THE PREFERRED EMBODIMENTS

Figure 1:
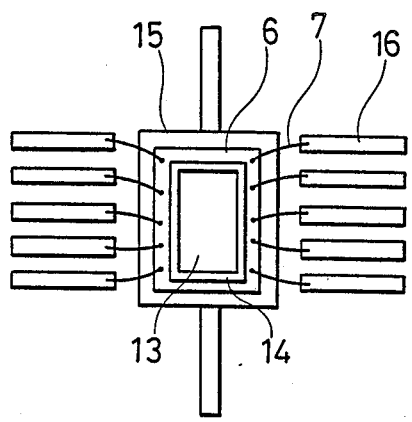
Figure 2:
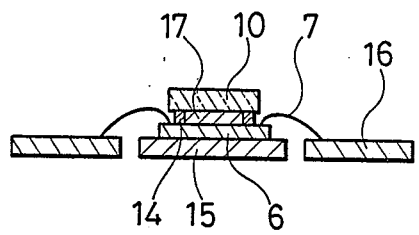
Figure 3:
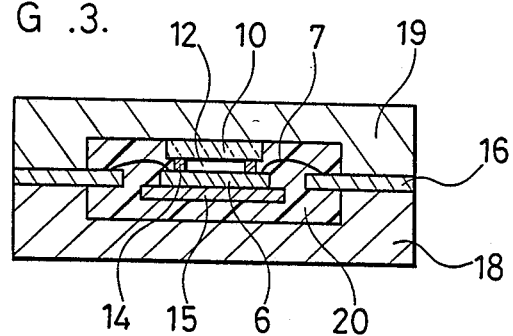

In order to explain the present invention in detail, reference will be particularly made to FIGS. 1 to 3.

FIG. 1 is a plan view showing a state where a wall of silicon rubber is produced which is attached to the external contour of the chip surface surrounding a picture element. The reference numeral 6 designates a rectangular chip, the numeral 15 designates a die pad for fixing the chip 6, the numeral 13 designates a picture element on the surface of the chip 6, the numeral 14 designates a wall of silicon rubber in a rectangular configuration, the numeral 16 designates a lead frame having fine patterns at the periphery of the die pad 15 (the respective fine patterns are connected at the periphery, but those are not shown). The numeral 7 designates a bonding wire for connecting the chip 6 and the lead frame 16.

FIG. 2 is a cross-sectional view showing a state where light transparent window material is position determined via the wall 14 on the chip 6. The reference numeral 17 designates a fluorinate, the numeral 10 designates a light transparent window material, which comprises glass in this case.

FIG. 3 is a cross-sectional view showing a state where resin is sealed in the metal mold. The reference numeral 18 designates a lower metal mold as a first metal mold, the numeral 19 designates an upper metal mold as a second metal mold, and a metal mold is constituted by the lower metal mold 18 and the upper metal mold 19. The numeral 20 designates epoxy resin as molding plastic material.

The method of producing this semiconductor device will be described.

First, as shown in FIG. 1, a wall of silicon rubber in a rectangular configuration of 20 $\mu$m height and 150 $\mu$m width is produced by screen printing such that it surrounds the picture element 13 at the external contour surface of the chip 6 surrounding the picture element 13. Next, the chip 6 is adhered onto the die pad 15 by soldering, and bonding wires 7 are wired so as to electrically connect the terminals of the chip 6 to the lead frame 16.

Next, as shown in FIG. 2, inactive liquid (fluorinate) 17 is dropped onto the surface of the chip 6, and the light transparent glass 10 is arranged at inside of the bonding wires 7. The light transparent glass 10 is provisionally adhered to the fluorinate 17, so as to be difficult to be moved from the chip 6.

The element constituted in this way is placed in the lower metal mold 18 as shown in FIG. 3, and the fluorinate 17 is vaporized by the heat of the metal mold, and thus a closed space 12 is produced between the chip 6 and the light transparent glass 10. Next, the upper metal mold 19 is over the lower metal mold 18, and the light transparent glass 10 and the wall of silicon rubber 14 are adhered to each other by the die pad sinking reaction force when the upper metal mold 19 is closed. Next, the resin 20 is molded by a transfer molding. The flow of resin into the surface of the chip 6 is prevented by the silicon rubber wall 14. Furthermore, a portion of the upper metal mold 19 in contact with the glass 10 is a mirror surface having a surface roughness lower than 2 $\mu$m, preferably, lower than 1 $\mu$m, and this can prevent the flow of resin into the boundary between the upper metal mold 19 and the glass 10.

The solid state imaging element produced in this way has a space ⅓ and a weight of 1/5 of the prior art element without hurting the transparency of light, and it is miniaturized. Furthermore, since resin is used as molding material, this results in superiority in mass producibility.

Figure 4:
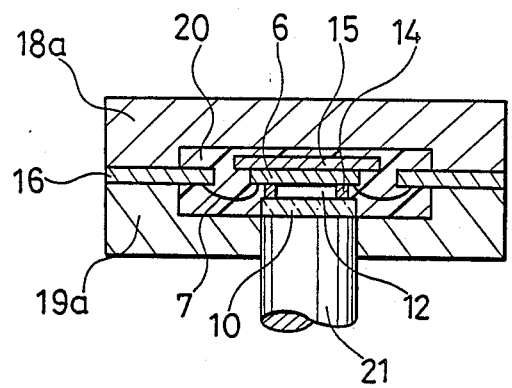
FIG. 4 is a cross-sectional view showing a state where resin is sealed in a metal mold in a second embodiment of the present invention.

FIG. 4 shows a second embodiment of the present invention. In FIG. 4, the reference numeral 18a designates an upper metal mold as a first metal mold, the numeral 19a designates a lower metal mold as a second metal mold, and the first metal mold 18a has a shallower convex portion (resin insertion portion) than that of the second metal mold 19a or that of the first metal mold 18 of FIG. 3. The numeral 21 designates a knockout pin provided at the second metal mold 19a, and the cross-section of knockout pin 21 is produced in the same configuration as that of glass 10. In this second embodiment, at first the knockout pin 21 is located slightly lower than the bottom surface of the second metal mold 19a thereby to produce a convex portion at the bottom surface, and glass 10 is position determined by being set at this convex portion.

Next, a chip 6 provided with the wall 14 is arranged on the glass 10 via the wall 14, the first metal mold 18a is overlapped on the second metal mold 19a, and resin is molded therein. Herein, the knockout pin 21 is restored to the same surface as the bottom surface of the second metal mold 19a at the plastic molding, and by doing so the position determination of the glass 10 against the metal mold can be conducted easily.

Furthermore, in the embodiment of FIG. 3, there is a possibility that resin 20 may be hung down at the periphery of the window surface caused by thermal stress being stored inside the resin after it is taken out from the metal mold. However, in the embodiment of FIG. 4, the convex portion of the first metal mold 18a is made shallower than that of the second metal mold 19a to obtain a thickness balance above and below by reducing the thickness of the molding resin 20 at the rear side of the chip 6 mounting surface of the die pad 15. Thus, the stresses stored inside the molding resin 20 can be released, and the transformation can be prevented.

Figure 5:
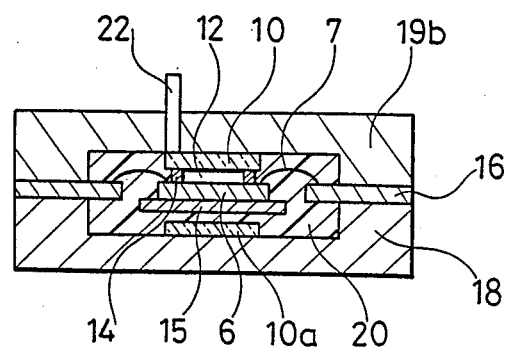
FIG. 5 is a cross-sectional view showing a state where resin is sealed in a metal mold in a third embodiment of the present invention.
Figure 6:
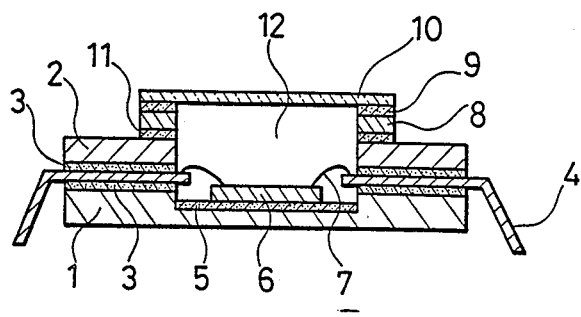
FIG. 6 is a cross-sectional view showing a prior art ceramic sealed solid state imaging element.

FIG. 5 shows a third embodiment of the present invention. The reference numeral 19b designates an upper metal mold as a second metal mold, and this is provided with an absorption breakthrough hole 22. The numeral 10a designates glass of the same material as the light transparent window material glass 10, and this is molded by resin together with the chip 6 and the glass 10 for the prevention of transformation. In this embodiment, glass 10a is mounted on the bottom surface of the lower metal mold 18, and a chip 6 which is provided with a wall 14 and die bonded to the lead frame 16 is mounted on this lower metal mold 18. Next, glass 10 is vacuum absorbed by the absorption breakthrough hole 22 thereby to fix the glass 10 to the upper metal mold 19b, and when this upper metal mold 19b and the lower metal mold 18 are overlapped with each other, the chip 6 and the glass 10 are aligned in their positions. Accordingly, it is possible to conduct the position determination easily. Furthermore, the glass 10a of the same material as the window material 10 is contained in the lower portion, and thus the stress stored in the molding resin is released thereby to prevent transformation.

Furthermore, in the above-illustrated embodiment, a silicon rubber wall 14 is produced and fixed to the external contour surface of the chip 6 surrounding the picture element 13 by a screen printing, but the constitution of this wall may not necessarily be restricted thereto. As wall material, polyimide resin, or polyphenyl quinoquitharin resin such as PIQ (produced by Hitachi-Kasei Co., Ltd.), U vanish (produced by Ube-Kosan Co., Ltd.), or Toreneath (produced by Toray Co., Ltd.), or inorganic material such as low melting point glass can be used. Furthermore, the wall can be produced by other methods such as a spin coating method, a resist method, or a vapor plating method. Furthermore, a frame of a configuration capable of surrounding the picture element 13, for example, a rectangular configuration may be produced independently, and this independent wall may be attached to the external contour surface of the chip surrounding the picture element 13. Furthermore, the wall 14 may be produced and fixed to the glass 10 of the light transparent window material, not fixed to the chip surface. Herein, the height of the wall 14 is preferably between about 1 $\mu$m to 50 $\mu$m to produce the space 12 which keeps the chip 6 and the light transparent window material out of contact with each other. Furthermore, the width of the wall is preferably about 150 $\mu$m so as to hold the strength to prevent the intrusion of resin into the space 12 at the time of plastic molding.

Furthermore in the above-illustrated first embodiment, the window material 10 is provisionally fixed to the chip 6 provided with a wall 14 by such as adhesive, and the constructed device is plastic sealed in a metal mold, and in the second embodiment, the chip 6 provided with the wall 14 and the window material are arranged in the metal mold, and plastic sealed therein. But the wall 14 may be attached to the window material 10, or all the three materials may be arranged in the metal mold. Furthermore, if inorganic material such as low melting point glass is used as the wall material, and NF1000-6R (produced by Somar Industry Co., Ltd.) or #360 (produced by Rocktight Co., Ltd.) as epoxy resin system adhesive are used as adhesive material, the device becomes more hermetic and can prevent the intrusion of water into the space 12 more effectively.

In the above-illustrated embodiment, a portion of the second metal mold 19 in contact with the glass 10 is made to have a mirror surface having surface roughness of lower than 1 μm, but this may be made to have a surface roughness of lower than 5 μm which prevents the injection between plastics into the boundary surface of the glass 10 and the metal mold.

Furthermore, as means for preventing the transformation, a convex portion may be provided at the outer surface of the molding resin at the rear surface of the chip mounting surface of the die pad 15.

In the above-illustrated embodiment, glass is used as light transparent window material, but the window material may not be restricted thereto, and transparent resin having thermoplasticity or thermohardening properties may be used.

In the above-illustrated embodiment, a solid state imaging element is described, but the present invention may be applied to ultraviolet ray erasion type read only memory (EPROM). In a case of EPROM, such as quartz glass or boro-silicate glass can be used as ultraviolet ray transparent glass, and the production processes can be conducted in the same way as those of the solid state imaging element.

As is evident from the foregoing description, according to the present invention, a process of attaching a wall surrounding the picture element to the external contour surface of either of the chip surface or the light transparent window material surrounding the picture element, a process of inserting the chip and the light transparent window material into the metal mold in such a manner that a closed space is produced between the chip and the light transparent window material via the wall, and a process of plastic sealing the device except for the light transparent window by filling in resin into the metal mold and making the resin hardened are provided. Accordingly, a semiconductor device having a light transparent window superior in characteristics due to the fact that there is no obstruction of light transparency, the miniaturized size of the device, and superiority in mass producibility can be obtained.

What is claimed is:

1. A method of producing a semiconductor device having a light transparent window, comprising the steps of:
   die bonding a semiconductor chip onto a lead frame;
   attaching a wall surrounding a picture element of said chip to an external contour surface of said chip;
   inserting said chip and said light transparent window into a metal mold and forming an empty closed space between said chip and said light transparent window via said wall; and
   plastic molding the device except for said light transparent window by filling resin into said metal mold and hardening said resin.

2. A method of producing a semiconductor device having a light transparent window as defined in claim 1, wherein said wall comprises silicon rubber or polyimide resin.

3. A method of producing a semiconductor device having a light transparent window as defined in claim 1, wherein said window is comprised of thermo-hardening transparent resin or thermo-plasticity transparent resin.

4. A method of producing a semiconductor device having a light transparent window as defined in claim 1, wherein said window comprises glass material.

5. A method of producing a semiconductor device having a light transparent window as defined in claim 1, wherein said chip is position determined into a first metal mold, said window is position determined into a second metal mold, said first and second metal molds are position determined over each other, so as to overlap and resin is filled into said overlapped metal molds.

6. A method of producing a semiconductor device having a light transparent window as defined in claim 5, wherein the position determination of said window into said second metal mold is conducted utilizing a knock-out pin.

7. A method of producing a semiconductor device having a light transparent window as defined in claim 5, wherein the position determination of said window into said second metal mold is conducted utilizing an absorption breakthrough hole provided at a portion of said second metal mold which is in contact with said window.

8. A method of producing a semiconductor device having a light transparent window as defined in claim 5, wherein the surface of said second metal mold in contact with said window is a mirror surface having a surface roughness of lower than 2 μm.

9. A method of producing a semiconductor device having a light transparent window as defined in claim 1, wherein said wall is produced by screen printing.

10. A method of producing a semiconductor device having a light transparent window as defined in claim 1, wherein said metal mold is provided with means for reducing stress stored inside of said molding resin.

11. A method of producing a semiconductor device having a light transparent window, comprising the steps of:
    producing a wall surrounding a picture element of a semiconductor chip at the external contour surface of said chip surrounding said picture element;
    die bonding said chip onto a lead frame after producing said wall;
    inserting said chip and said light transparent window into a metal mold and forming an empty closed space between said chip and said light transparent window via said wall; and
    plastic sealing the device except for said light transparent window by filling resin into said metal mold and hardening said resin.

12. A method of producing a semiconductor device having a light transparent window as defined in claim 11, wherein said wall comprises silicon rubber or polyimide resin.

13. A method of producing a semiconductor device having a light transparent window as defined in claim 11, wherein said window is comprised of material chosen from thermo-hardening transparent resin or thermo-plasticity transparent resin.

14. A method of producing a semiconductor device having a light transparent window as defined in claim 11, wherein said material comprises glass material.

15. A method of producing a semiconductor device having a light transparent window as defined in claim 11, wherein said chip is position determined into a first metal mold, said window is position determined into a second metal mold, said first and second metal molds are position determined over each other so as to overlap, and resin is filled into said overlapped metal molds.

16. A method of producing a semiconductor device having a light transparent window as defined in claim 15, wherein the position determination of said window into said second metal mold is conducted utilizing a knockout pin.

17. A method of producing a semiconductor device having a light transparent window as defined in claim 15, wherein the position determination of said window into said second metal mold is conducted utilizing an absorption breakthrough hole provided at a portion of said second metal mold which is in contact with said window.

18. A method of producing a semiconductor device having a light transparent window as defined in claim 15, wherein the surface of said second metal mold in contact with said window is a mirror surface having a surface roughness of lower than 2 $\mu$m.

19. A method of producing a semiconductor device having a light transparent window as defined in claim 11, wherein said wall is produced by screen printing.

20. A method of producing a semiconductor device having a light transparent window as defined in claim 11, wherein said metal mold is provided with means for reducing stress stored inside of said molding resin.

21. A method of producing a semiconductor device having a light transparent window, comprising the steps of:
   die bonding a semiconductor chip to a lead frame;
   attaching a wall which is to surround a picture element of said chip to said light transparent window;
   inserting said chip and said light transparent window into a metal mold snd forming an empty closed space between said chip and said window via said wall; and
   plastic molding said device except for said light transparent window by filling resin into said metal mold and hardening said resin.

* * * * *